United States Patent
Zhang et al.

(10) Patent No.: US 11,860,239 B2
(45) Date of Patent: Jan. 2, 2024

(54) SYSTEMS AND METHODS FOR DETECTING AND ISOLATING FAULTS WITHIN A POWER INVERTER

(71) Applicant: GM GLOBAL TECHNOLOGY OPERATIONS LLC, Detroit, MI (US)

(72) Inventors: Jiyu Zhang, Sterling Heights, MI (US); Nomar S. Gonzalez Santini, Lakeland, FL (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/706,745

(22) Filed: Mar. 29, 2022

(65) Prior Publication Data

US 2023/0314530 A1  Oct. 5, 2023

(51) Int. Cl.
- *G01R 31/40* (2020.01)
- *H02M 7/00* (2006.01)
- *H02M 1/32* (2007.01)

(52) U.S. Cl.
CPC ............ *G01R 31/40* (2013.01); *H02M 1/327* (2021.05); *H02M 7/003* (2013.01)

(58) Field of Classification Search
CPC ........ G01R 31/40; H02M 1/327; H02M 7/003
USPC ...................................... 324/120, 76.11, 500
See application file for complete search history.

(56) References Cited

U.S. PATENT DOCUMENTS

| | | | |
|---|---|---|---|
| 10,026,241 B1 | 7/2018 | Sankavaram et al. | |
| 10,054,030 B2 | 8/2018 | Duan et al. | |
| 10,152,834 B1 | 12/2018 | Sankavaram et al. | |
| 10,161,370 B2 | 12/2018 | Sarwar et al. | |
| 10,167,803 B2 | 1/2019 | Sarwar et al. | |
| 10,197,636 B1* | 2/2019 | Subotski | H02H 7/1213 |
| 10,273,867 B2 | 4/2019 | Duan et al. | |
| 10,355,634 B1 | 7/2019 | Zhang et al. | |
| 10,378,501 B2 | 8/2019 | Sarwar et al. | |
| 10,408,098 B2 | 9/2019 | Sarwar et al. | |
| 10,443,530 B1 | 10/2019 | Li et al. | |
| 10,553,043 B2 | 2/2020 | Duan et al. | |
| 10,598,732 B2 | 3/2020 | Sarwar et al. | |
| 10,670,385 B2 | 6/2020 | Sarwar et al. | |
| 10,948,079 B2 | 3/2021 | Duan et al. | |
| 11,063,794 B2* | 7/2021 | Shibata | G11C 27/02 |
| 11,125,830 B2* | 9/2021 | Naito | F28F 3/02 |
| 11,133,771 B2 | 9/2021 | Zhang et al. | |
| 11,609,279 B1* | 3/2023 | Xu | G01R 31/40 |
| 2015/0233979 A1* | 8/2015 | Barrenscheen | G01R 19/16547 324/120 |

(Continued)

*Primary Examiner* — Giovanni Astacio-Oquendo

(57) ABSTRACT

A diagnostic system for diagnosing faults in a power inverter including a power loss estimating module configured to calculate a power loss of one or more components of the power inverter. A junction temperature estimating module is configured to output an estimated junction temperature of the one or more components of the power inverter. A plurality of temperature sensors is configured to sense a plurality of temperatures of a plurality of inverter legs, respectively. A health indicator generating module is configured to generate a plurality of health indicators in response to the estimated junction temperature and the plurality of sensed temperatures of the plurality of inverter legs. A fault identification module is configured to selectively identify one of an inverter fault, a temperature sensor fault, and no fault in response to the plurality of health indicators.

20 Claims, 7 Drawing Sheets

(56) References Cited

U.S. PATENT DOCUMENTS

| | | |
|---|---|---|
| 2019/0040812 A1 | 2/2019 | Sarwar et al. |
| 2019/0250205 A1 | 8/2019 | Sarwar et al. |
| 2019/0293695 A1* | 9/2019 | Guthrie .............. G01R 19/0038 |
| 2021/0175826 A1 | 6/2021 | Zhang et al. |
| 2021/0184610 A1 | 6/2021 | Zhang et al. |

* cited by examiner

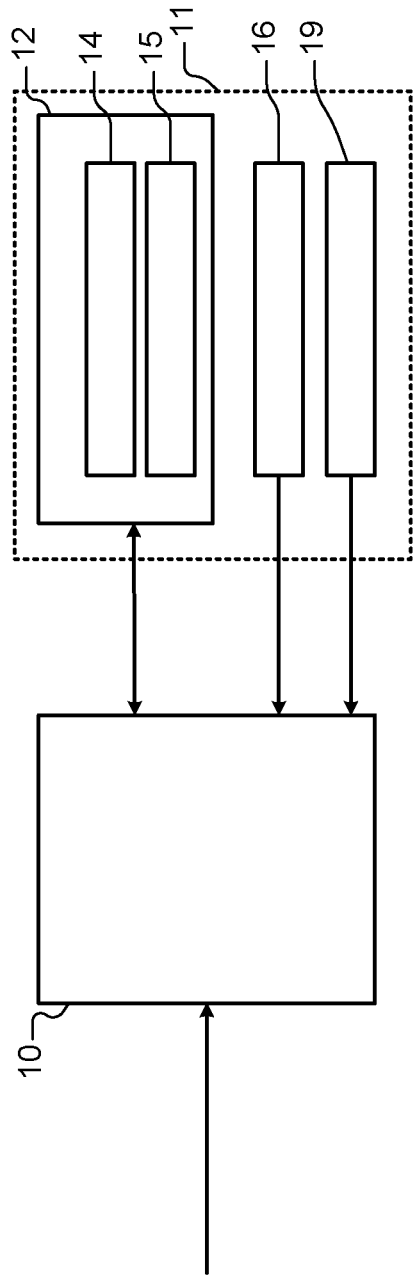
FIG. 1
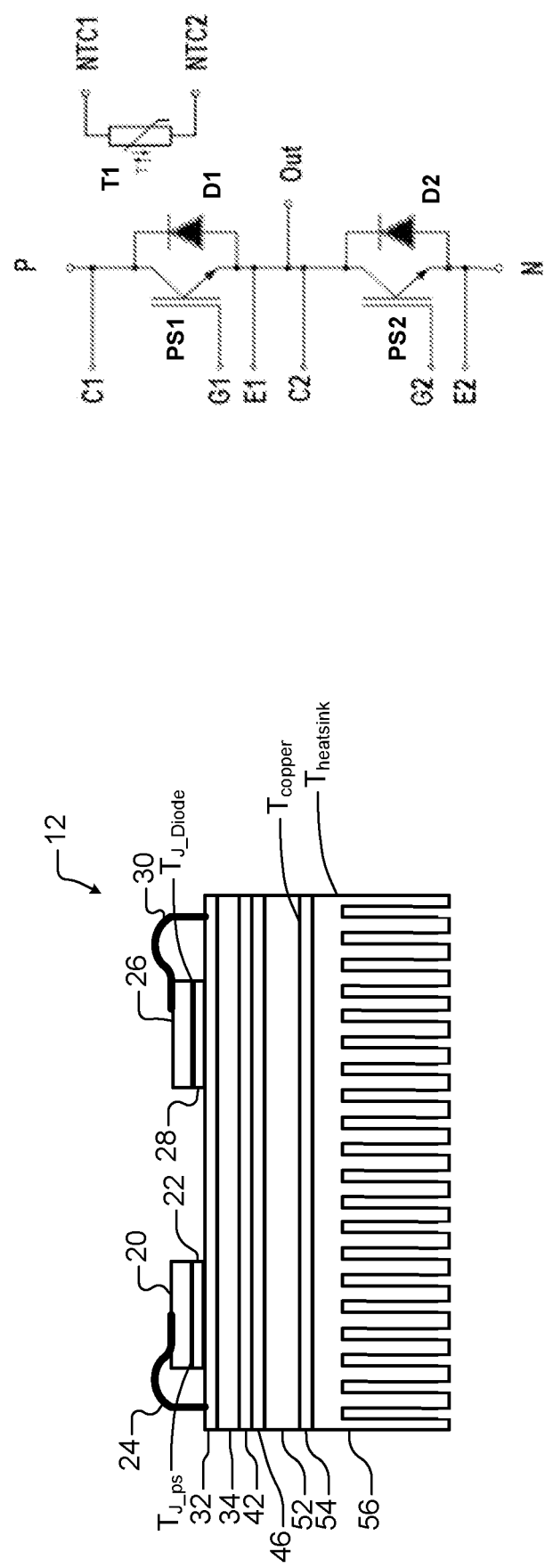
FIG. 2B
FIG. 2A

SYSTEMS AND METHODS FOR DETECTING AND ISOLATING FAULTS WITHIN A POWER INVERTER

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to power inverter modules for electric vehicles, and more particularly to diagnostic systems and methods for detecting and isolating faults within power inverter modules.

Electric vehicles (EVs) such as battery electric vehicles (BEVs), hybrid vehicles, and/or fuel cell vehicles include one or more electric machines and a battery system. The battery system includes one or more battery cells, modules and/or packs that are connected in series and/or parallel. A power control system is used to control charging and/or discharging of the battery system during charging and/or driving. The power control system includes a power inverter module that is arranged between the battery system and the electric machine.

SUMMARY

A diagnostic system for diagnosing faults in a power inverter including a power loss estimating module configured to calculate a power loss of one or more components of the power inverter. A junction temperature estimating module is configured to output an estimated junction temperature of the one or more components of the power inverter. A plurality of temperature sensors is configured to sense a plurality of temperatures of a plurality of inverter legs, respectively. A health indicator generating module is configured to generate a plurality of health indicators in response to the estimated junction temperature and the plurality of sensed temperatures of the plurality of inverter legs. A fault identification module is configured to selectively identify one of an inverter fault, a temperature sensor fault, and no fault in response to the plurality of health indicators.

In other features, the fault identification module compares the plurality of health indicators to a plurality of predetermined thresholds. The fault identification module identifies the inverter fault in response to all of the plurality of health indicators being greater than corresponding ones of the plurality of predetermined thresholds, respectively. The fault identification module identifies the temperature sensor fault in response to one or more of the plurality of health indicators being greater than corresponding ones of the plurality of predetermined thresholds and at least one of the plurality of health indicators being less than a corresponding one of the plurality of predetermined thresholds.

In other features, the power loss estimating module estimates the power loss including conduction loss and switching loss in response to vehicle operating conditions. The one or more components of the power inverter comprise a diode and a power switch. The power loss estimating module comprises a first calculating module configured to calculate a voltage drop, an on resistance, at least one of a power loss of a diode and a power loss of a power switch, a power factor, and a modulation index in response to a phase voltage and a filtered switch current. A power loss module is configured to calculate conduction and switching loss of at least one of the power switch and the diode in response to the voltage drop, the on resistance, the at least one of the power loss of the diode and the power loss of the power switch, the power factor, the modulation index and a switching strategy/frequency.

In other features, the one or more components of the power inverter comprise at least one of a diode and a power switch and wherein the estimated junction temperature corresponds to at least one of an estimated power switch junction temperature and an estimated diode junction temperature. The health indicator generating module generates the plurality of health indicators in response to an absolute value of a difference between the estimated diode junction temperature of the plurality of inverter legs and a product of the plurality of sensed temperatures of the plurality of inverter legs and a plurality of predetermined constants, respectively.

In other features, the health indicator generating module generates the plurality of health indicators in response to an absolute value of a difference between the estimated power switch junction temperature of the plurality of inverter legs and a product of the plurality of sensed temperatures of the plurality of inverter legs and a plurality of predetermined constants, respectively. The fault identification module is configured to generate a first fault type in response to the inverter fault and to generate a second fault type in response the temperature sensor fault.

A method for diagnosing faults in a power inverter includes calculating a power loss of one or more components of the power inverter including a plurality of inverter legs; generating an estimated junction temperature of the one or more components of the power inverter; sensing a plurality of temperatures of a plurality of inverter phase legs, respectively; generating a plurality of health indicators in response to the estimated junction temperature and the plurality of sensed temperatures of the plurality of inverter legs; and selectively identifying one of an inverter fault, a temperature sensor fault, and no fault in response to the plurality of health indicators.

In other features, the plurality of health indicators to a plurality of predetermined thresholds. The method includes identifying the inverter fault in response to all of the plurality of health indicators being greater than corresponding ones of the plurality of predetermined thresholds, respectively.

In other features, the method includes identifying the temperature sensor fault in response to one or more of the plurality of health indicators being greater than corresponding ones of the plurality of predetermined thresholds and at least one of the plurality of health indicators being less than a corresponding one of the plurality of predetermined thresholds. The method includes estimating the power loss including conduction loss and switching loss in response to vehicle operating conditions.

In other features, the one or more components of the power inverter comprise a diode and a power switch and the method further comprises calculating a voltage drop, an on resistance, a least one of a power loss of the diode and a power loss of the power switch, a power factor, and a modulation index in response to phase voltage and a filtered switch current; and calculating conduction and switching loss of the at least one of the power switch and the diode in response to the voltage drop, the on resistance, the at least one of the power loss of the diode and the power loss of the power switch, the power factor, the modulation index and a switching strategy/frequency.

In other features, the one or more components of the power inverter comprise at least one of a diode and a power switch. The estimated junction temperature corresponds to at least one of an estimated power switch junction temperature and an estimated diode junction temperature.

In other features, the method includes generating the plurality of health indicators in response to an absolute value of a difference between the estimated diode junction temperature of the plurality of inverter legs and a product of the plurality of sensed temperatures of the plurality of inverter legs and a plurality of predetermined constants, respectively. The method includes generating the plurality of health indicators in response to an absolute value of a difference between the estimated power switch junction temperature of the plurality of inverter legs and a product of the sensed temperature of the plurality of inverter legs and a plurality of constants, respectively.

The method includes generating a first fault type in response to the inverter fault; and generating a second fault type in response the temperature sensor fault.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example of a controller for a power inverter module according to the present disclosure;

FIG. 2A is a side cross-sectional view of an example of a power inverter;

FIG. 2B is an electrical schematic of an example of a phase leg of the power inverter;

In the drawings, reference numbers may be reused to identify similar and/or identical elements.

DETAILED DESCRIPTION

Figure 3:
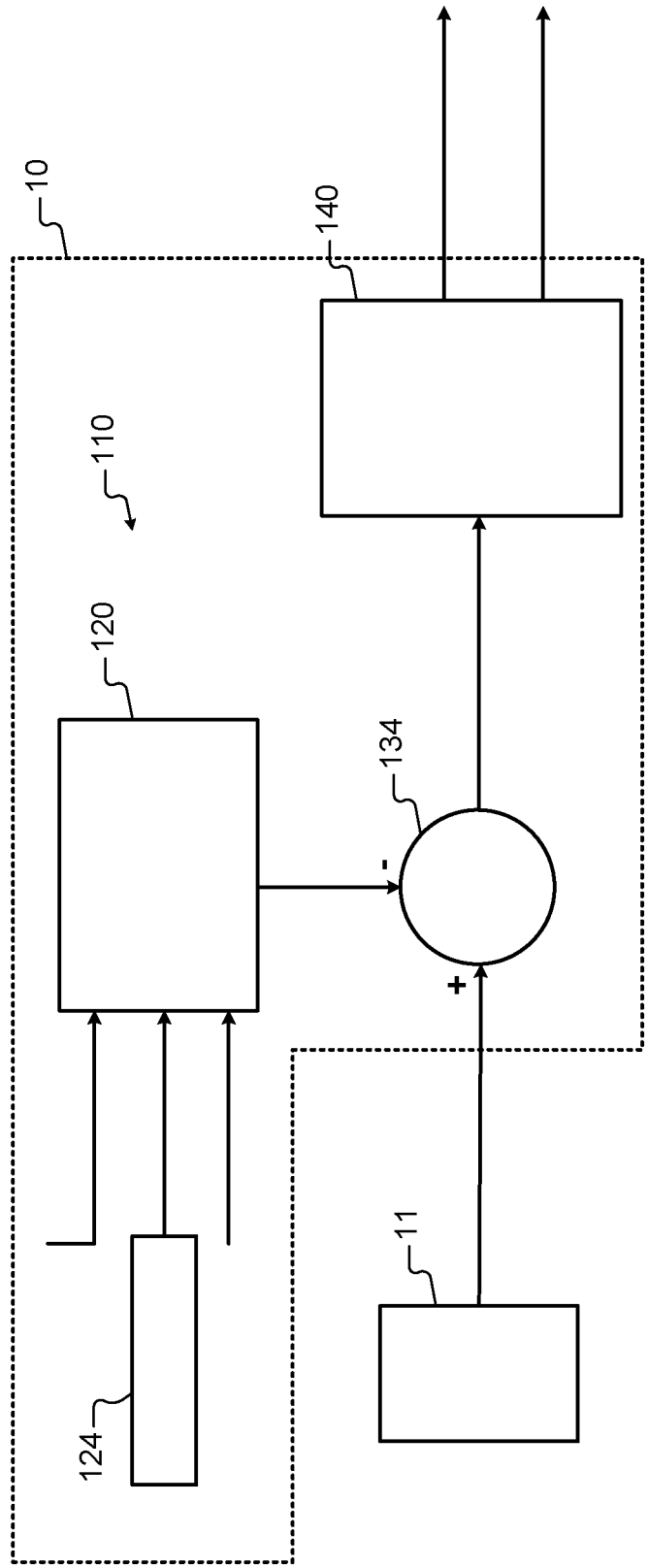
FIG. 3 is a functional block diagram of an example of a fault diagnostic module according to the present disclosure.

While the foregoing disclosure describes an example of systems and methods for diagnosing faults in a power inverter module for an electric vehicle (EV), the systems and methods can be used to diagnose faults in power inverter modules in other types of vehicles or non-vehicular applications.

Referring now to FIG. 1, a controller 10 for a power inverter module 11 is shown. The power inverter module 11 includes a power inverter 12 including components such as power switches (PS) 14 and diodes 15. In some examples, the power switches 14 include insulated gate bipolar transistors (IGBTs), although other types of power switches can be used. The power inverter module 11 optionally includes phase current sensors 16 to sense current in each phase leg, and temperature sensors 19 to sense a temperature of each phase leg. In some examples, the temperature sensors 19 include thermistors. In some examples, the thermistors include negative temperature coefficient (NTC) thermistors, although other types of thermistors or temperature sensors can be used.

When a fault occurs in the power inverter module, manufacturers typically replace the entire power inverter module rather than diagnose faults in individual components. In many situations, the fault may have occurred in a temperature sensor such as a thermistor. Repairs can be made by replacing the faulty thermistor, which is far less costly than replacing the entire power inverter module.

Referring now to FIGS. 2A and 2B, while specific examples of power inverters 12 are shown, other types of power inverters can be used. In FIG. 2A, the power inverter 12 includes a power switch integrated circuit (IC) 20 connected by solder 22 and/or bond wires 24 to a metal layer 32 such as copper or another suitable metal material. A diode IC 26 is connected by solder and/or bond wires 30 to the metal layer 32.

A ceramic layer 34 is arranged between the metal layer 32 and another metal layer 42. The metal layer 42 is connected by solder 46 to a copper baseplate 52. A thermal conducting layer or material 54 such as thermal grease is arranged between the copper baseplate 52 and a heatsink 56. During operation, a temperature of a junction of the power switch IC 20 and the diode IC 26 are estimated and monitored. While a specific layout is shown for purposes of illustration, the power inverter 12 can have other configurations.

In FIG. 2B, an example of one phase leg of the power inverter 12 includes a power switch PS1 including a gate, a first terminal, and a second terminal. The first terminal of the power switch PS1 is connected to a positive terminal of the battery. The second terminal of the power switch PS1 is connected to a first terminal of the power switch PS2. A second terminal of the power switch PS2 is connected to a negative terminal of the battery. The controller 10 controls switching of the power switches PS1 and PS2 by sending signals to the gates of the power switches PS1 and PS2. Diode D1 is connected anti-parallel to the first and second terminals of the power switch PS1. Diode D2 is connected anti-parallel to the first and second terminals of the power switch PS2. An output of the phase leg is connected to a phase stator winding. A temperature sensor such as a thermistor T1 is arranged to sense a temperature of the phase leg (for example, in proximity to the diode and the power switch).

Referring now to FIG. 3, the controller 10 includes a fault detection module 110. The fault detection module 110 includes a power loss estimating module 124, a junction temperature estimating module 120, a health indicator generating module 134 and a fault isolation module 140.

The power loss estimating module 124 estimates the power loss in the power inverter based on vehicle operating conditions. In some examples, the controller 10 is connected to a controller area network (CAN) bus or other interface to receive vehicle operating condition data from other vehicle controllers such as a motor controller, a battery monitoring system, etc.

The junction temperature estimating module 120 estimates junction temperatures of the power switches and diodes based on vehicle operating parameters such as coolant temperature, power loss, thermal impedance, or other values. The health indicator generating module 134 compares the sensed temperatures from the power inverter module 11 and the junction temperatures of the power switches and diode and determines whether there is an inverter fault, a thermistor fault or no fault based on the comparison.

Figure 4A:
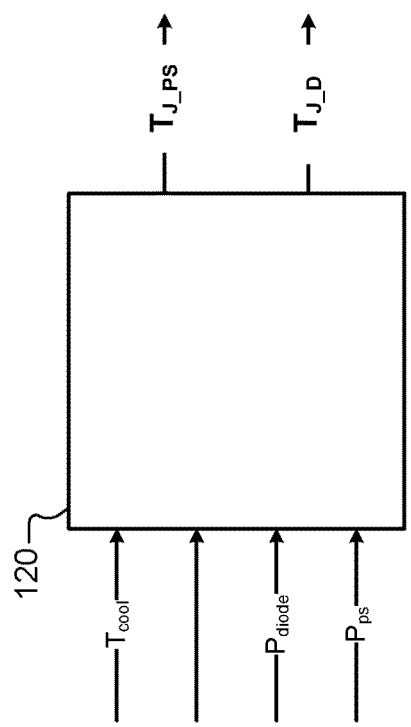
FIGS. 4A and 4B are functional block diagrams of examples of power loss estimating modules according to the present disclosure.
Figure 4B:
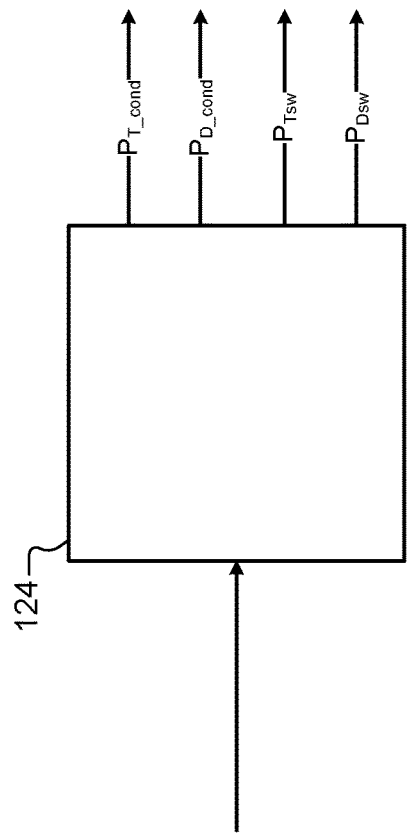

Referring now to FIGS. 4A and 4B, examples of the power loss estimating modules 124 are shown. In FIG. 4A, an example of the power loss estimating module 124 determines the conduction loss and the switching loss for the power switches ($P_{G\_cond}$ and $PD_{G\_sw}$) and the diodes ($P_{D\_cond}$ and $P_{D\_sw}$) based on vehicle operating conditions. In some examples, the vehicle operating conditions are selected from a group consisting of torque, speed, battery voltage VDC and/or other vehicle operating conditions. In some examples, the power loss estimating module 124 is implemented as an operational lookup table (LUT) that is indexed by the one or more vehicle operating conditions and outputs the conduction loss and the switching loss for the power switches ($P_{G\_cond}$ and $PD_{G\_sw}$) and the diodes ($P_{D\_cond}$ and $P_{D\_sw}$).

In FIG. 4B, another example of the power loss estimating module 124 is shown in further detail. The power loss estimating module 124 includes a calculating module 210 including a power factor and modulation index calculator 214. The power factor and modulation index calculator 214 calculates a power factor $\phi$ and modulation index (MI) in response to phase voltage $v^*_{abc}$ and a filtered switch current $I_{s\_filt}$. A voltage drop and energy loss interpolating module 218 calculates voltage drop $V_{drop}$ and power loss $E_{sw}$ and $E_{rr}$.

The calculating module 210 outputs the voltage drop $V_{drop}$ and on resistance RON, the power loss due to the switch $E_{sw}$ and diode $E_{rr}$, the power factor $\phi$ and the modulation index (MI) to a conduction loss and switching loss calculator 230. The conduction loss and switching loss calculator 230 calculates the conduction loss and the switching loss for the power switches ($P_{G\_cond}$ and $PD_{G\_sw}$) and the diodes ($P_{D\_cond}$ and $P_{D\_sw}$) based on the voltage drop $V_{drop}$ and the on resistance RON, the power loss due to the switch $E_{sw}$ and diode $E_{rr}$, the power factor $\phi$ and the modulation index (MI).

Figure 5A:
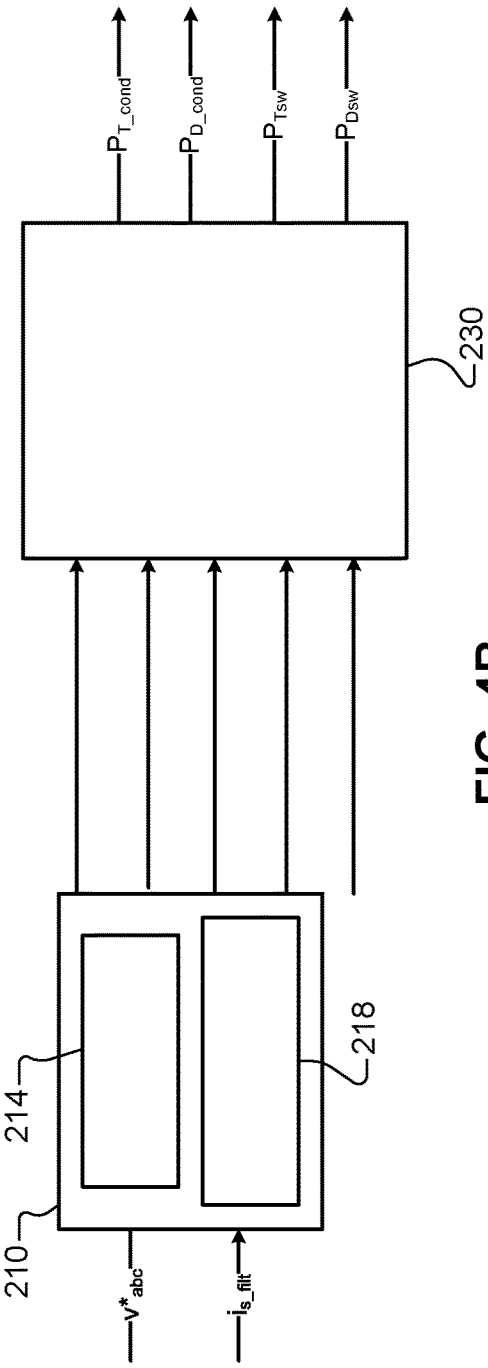
FIGS. 5A and 5B are functional block diagrams of examples of junction junction temperature estimating modules according to the present disclosure.
Figure 5B:
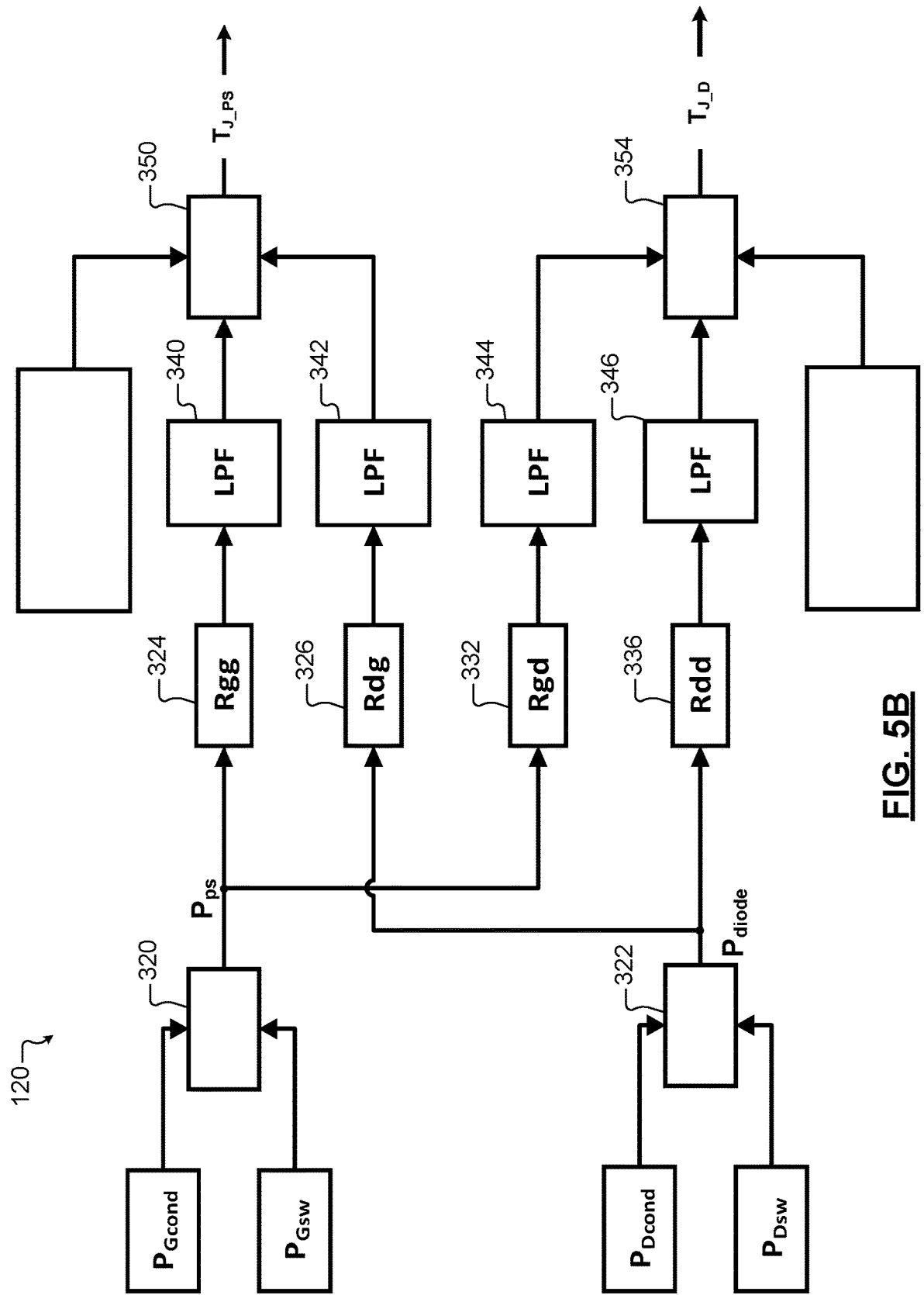

Referring now to FIGS. 5A and 5B, examples of the junction temperature estimating modules 120 are shown. In FIG. 5A, the junction temperature estimating module 120 generate an estimated power switch junction temperature ($T_{J\_PS}$) and/or an estimated diode junction temperature ($T_{J\_D}$) in response to the coolant temperature $T_{cool}$, thermal impedance, power loss in the diode ($P_{diode}$) and power loss in the power switch ($P_{ps}$).

In FIG. 5B, another example of the junction temperature estimating module 120 is shown and includes adders 320, 322, 350 and 354, multipliers 324, 326, 332 and 336, and low pass filters (LPFs) 340, 342, 344, and 346. $P_{G\_cond}$ and $PD_{G\_sw}$ are input to the adder 320. An output of the adder 320 is input to the multipliers 324 and 332, which multiply the power sum ($P_{ps}$) by a first constant $R_{gg}$ and a second constant $R_{gd}$, respectively.

$P_{D\_cond}$ and $P_{D\_sw}$ are input to the adder 322. An output of the adder 322 is input to the multipliers 326 and 336, which multiply the power sum ($P_{diode}$) by a first constant Rag and a second constant Rad, respectively.

Outputs of the multipliers 324 and 332 are input to LPFs 340 and 344, respectively. Outputs of the multipliers 326 and 336 are input to LPFs 342 and 346, respectively. Outputs of the LPFs 340 and 342 and the coolant temperature are input to the adder 350. The adder 350 outputs the estimated power switch junction temperature ($T_{J\_PS}$). Outputs of the LPFs 344 and 346 and the coolant temperature are input to the adder 354. The adder 354 outputs the estimated diode junction temperature ($T_{J\_D}$).

Figure 6A:
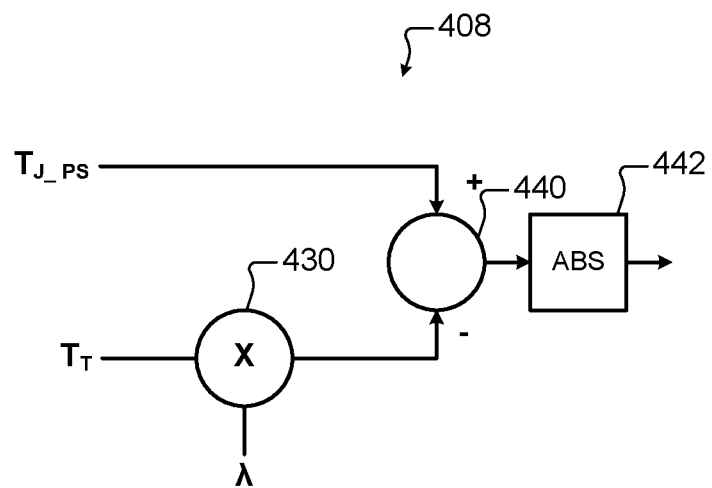
FIGS. 6A and 6B are functional block diagrams of examples of health indicator generating modules according to the present disclosure.
Figure 6B:
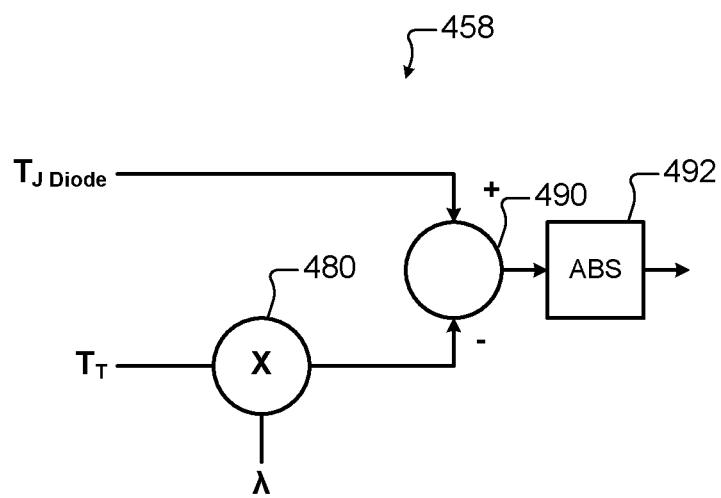

Referring now to FIGS. 6A and 6B, examples of health indicator generating modules 408 and 458 are shown. In FIG. 6A, the health indicator generating module 408 includes a multiplier 430 that multiplies a sensed temperature $T_T$ by a constant $\lambda$. The health indicator generating module 408 includes a difference module 440 that generates a difference between the estimated power switch junction temperature $T_{J\_PS}$ and $\lambda^*T_T$. An absolute value module 442 generates an absolute value of the difference. In some examples, these calculations are made for each phase.

In FIG. 6B, the health indicator generating module 458 includes a multiplier 480 that multiplies the sensed temperature $T_T$ by the constant $\lambda$. The health indicator generating module 458 includes a difference module 490 that generates a difference between the estimated diode junction temperature $T_{D\_PS}$ and $\lambda^*T_{T\_D}$. An absolute value module 442 generates an absolute value of the difference. In some examples, these calculations are made for each phase leg.

Figure 7:
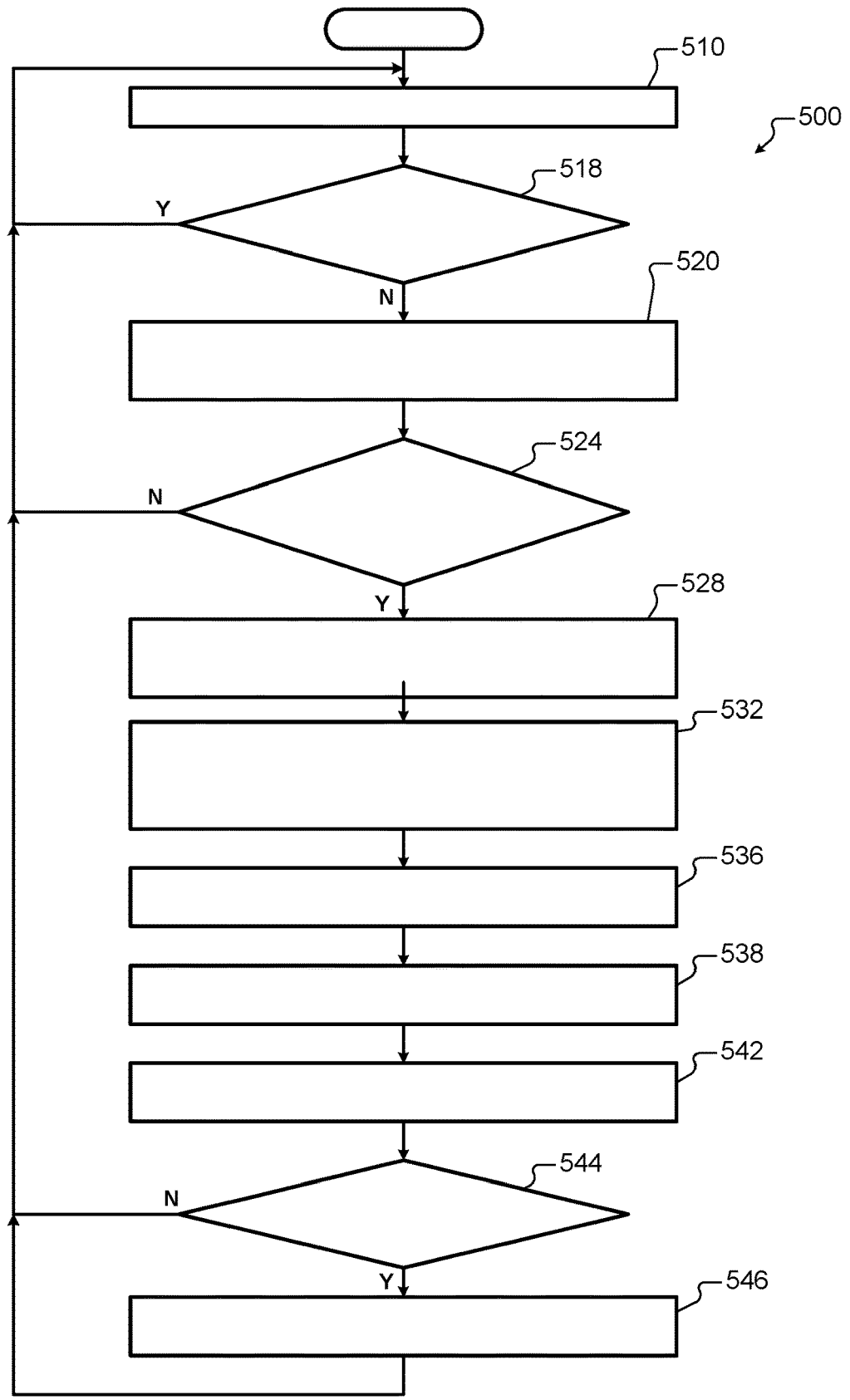
FIGS. 7 and 8 are flowcharts of an example of a method for diagnosing faults in a power inverter module according to the present disclosure.
Figure 8:
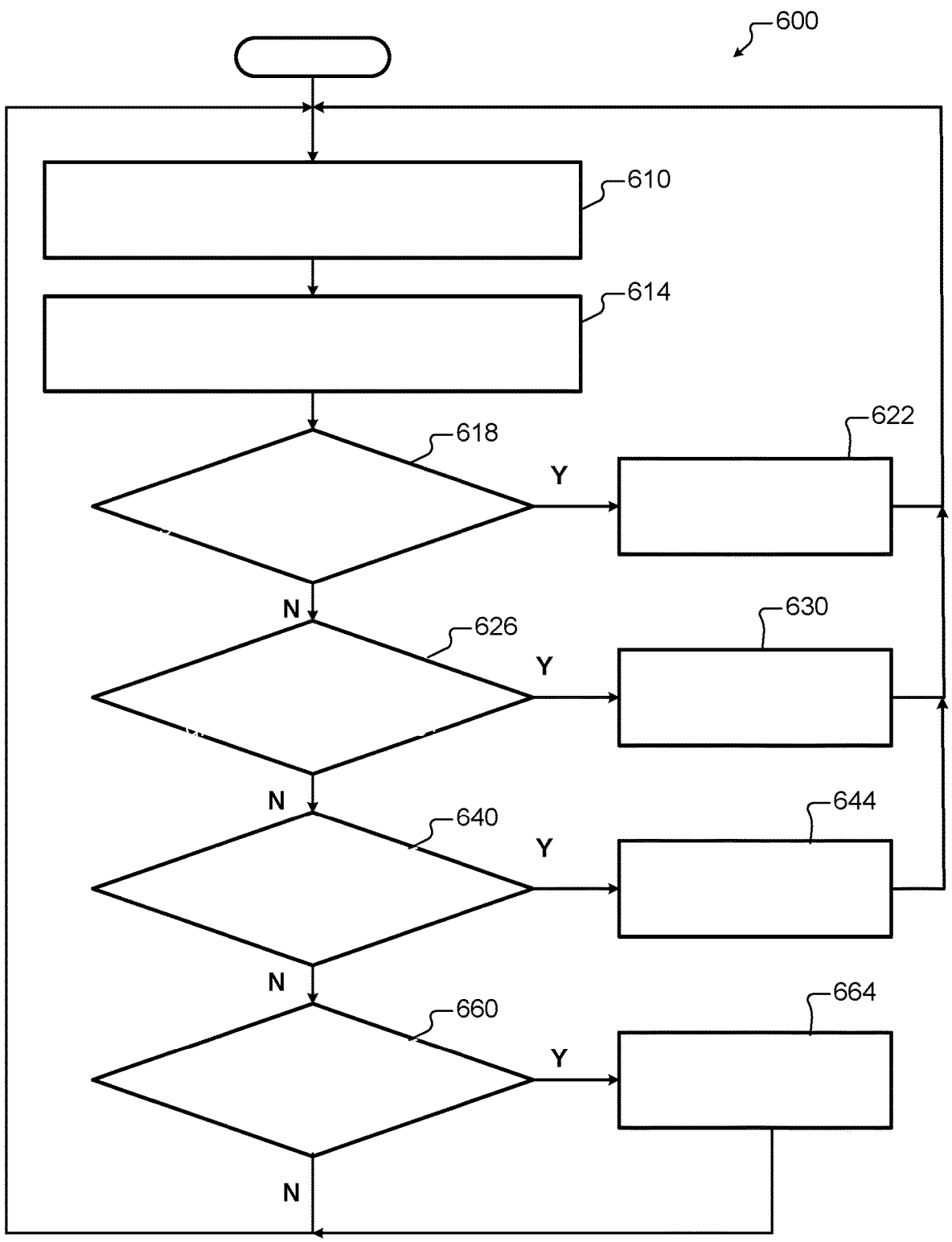

Referring now to FIGS. 7 and 8, methods 500 and 600 for diagnosing faults in a power inverter module are shown. In FIG. 7, a method 500 reads vehicle speed and torque at 510. At 518, the method determines whether the vehicle is in a stall condition. If 518 is false, the method calculates the health of the phase current sensors and the coolant sensors at 520. At 524, the method determines whether all of the current and coolant sensors are healthy based on the calculated health. If 524 is true, the temperature sensors for each of the phase legs are read at 528. At 532, the motor currents, voltage commands and switching strategy/frequency (and/or other vehicle operating parameters) are read. At 536, the inverter loss is calculated. At 538, the inverter junction temperature is estimated. At 542, health indicators are calculated. At 544, the method determines whether there is a fault. If 542 is true, the method generates an alert at 546.

In FIG. 8, the method 600 allows differentiation between inverter faults (such as power switch and diode faults) and thermistor faults. At 610, the method calculates the absolute value of health indicator for the diode and the power switch for each phase leg. At 614, the method compares the absolute values to the corresponding thresholds.

In some examples, Diff(T_t1, T_j,PS) is compared with Th1, where Diff( ) is a function corresponding to the difference modules in FIGS. 6A and 6B. Likewise, Diff (T_t2, T_j, PS) is compared to Th2, Diff(T_t3,T_j, PS) is compared to Th3, Diff(T_ntc1, T_j,diode) is compared to Th4, Diff(T_ntc2, T_j, diode) is compared to Th5, and Diff(T_ntc3,T_j, diode) is compared to Th6.

At 618, the method determines whether the health indicator values are greater than all of the corresponding thresholds. If 618 is true, the method identifies a fault with the power inverter (eg. the power switches, the diodes or other component). If 618 is false, the method continues at 626 and determines whether Diff(T_t1, T_j,PS)>Th1 and Diff (T_ntc1, T_j,diode)>Th4 and the other differences are less than their corresponding thresholds. If 626 is true, the method declares a fault with the first thermistor at 630.

If 626 is false, the method continues at 640 and determines whether Diff(T_t2, T_j, PS)>Th2 and Diff(T_ntc2, T_j, diode)>Th5 and the other differences are less than their corresponding thresholds. If 640 is true, the method declares a fault with the second thermistor at 644.

If 626 is false, the method continues at 660 and determines whether Diff(T_t3, T_j, PS)>Th3 and Diff(T_ntc3, T_j, diode)>Th6 and the other differences are less than their corresponding thresholds. If 660 is true, the method declares a fault with the third thermistor at 664. The method continues from 622, 630, 644, 660 (if false), and 664 at 610.

As can be appreciated, the diagnostic system can differentiate between temperature sensor faults or power inverter faults at least in part based on the estimated power switch temperature standing alone, the estimated diode temperature standing alone or based on both values (as described above). In the case where the diagnostic system differentiates between temperature sensor faults or power inverter faults in part based on the estimated power switch temperature standing alone, a power inverter fault occurs when all of the health indicators (3 in this case rather than 6) exceed the corresponding thresholds and temperature sensors faults occur when individual ones of the health indicators exceed the corresponding thresholds. A similar approach is used when diagnosis is based on the estimated diode temperature standing alone.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A diagnostic system for diagnosing faults in a power inverter, comprising
   a power loss estimating module configured to calculate a power loss of one or more components of the power inverter;
   a junction temperature estimating module configured to output an estimated junction temperature of the one or more components of the power inverter;
   a plurality of temperature sensors configured to sense a plurality of temperatures of a plurality of inverter legs, respectively; and
   a health indicator generating module configured to generate a plurality of health indicators in response to the estimated junction temperature and the plurality of sensed temperatures of the plurality of inverter legs; and
   a fault identification module configured to selectively identify one of an inverter fault, a temperature sensor fault, and no fault in response to the plurality of health indicators.

2. The diagnostic system of claim 1, wherein the fault identification module compares the plurality of health indicators to a plurality of predetermined thresholds.

3. The diagnostic system of claim 2, wherein the fault identification module identifies the inverter fault in response to all of the plurality of health indicators being greater than corresponding ones of the plurality of predetermined thresholds, respectively.

4. The diagnostic system of claim 2, wherein the fault identification module identifies the temperature sensor fault in response to one or more of the plurality of health indicators being greater than corresponding ones of the plurality of predetermined thresholds and at least one of the plurality of health indicators being less than a corresponding one of the plurality of predetermined thresholds.

5. The diagnostic system of claim 1, wherein the power loss estimating module estimates the power loss including conduction loss and switching loss in response to vehicle operating conditions.

6. The diagnostic system of claim 1, wherein the one or more components of the power inverter comprise a diode and a power switch and wherein the power loss estimating module comprises:
   a first calculating module configured to calculate a voltage drop, an on resistance, at least one of a power loss of the diode and a power loss of the power switch, a power factor, and a modulation index in response to a phase voltage and a filtered switch current; and
   a power loss module configured to calculate conduction and switching loss of at least one of the power switch and the diode in response to the voltage drop, the on resistance, the at least one of the power loss of the diode and the power loss of the power switch, the power factor, the modulation index and a switching strategy/frequency.

7. The diagnostic system of claim 1, wherein the one or more components of the power inverter comprise at least one of a diode and a power switch and wherein the estimated junction temperature corresponds to at least one of an estimated power switch junction temperature and an estimated diode junction temperature.

8. The diagnostic system of claim 7, wherein the health indicator generating module generates the plurality of health indicators in response to an absolute value of a difference between the estimated diode junction temperature of the plurality of inverter legs and a product of the plurality of sensed temperatures of the plurality of inverter legs and a plurality of predetermined constants, respectively.

9. The diagnostic system of claim 8, wherein the health indicator generating module generates the plurality of health indicators in response to an absolute value of a difference between the estimated power switch junction temperature of the plurality of inverter legs and a product of the plurality of sensed temperatures of the plurality of inverter legs and the plurality of predetermined constants, respectively.

10. The diagnostic system of claim 1, wherein the fault identification module is configured to generate a first fault type in response to the inverter fault and to generate a second fault type in response the temperature sensor fault.

11. A method for diagnosing faults in a power inverter, comprising
    calculating, via a controller, a power loss of one or more components of the power inverter including a plurality of inverter legs;
    generating an estimated junction temperature of the one or more components of the power inverter;
    sensing a plurality of temperatures of a plurality of inverter phase legs, respectively;
    generating a plurality of health indicators in response to the estimated junction temperature and the plurality of sensed temperatures of the plurality of inverter legs; and
    selectively identifying, via the controller, one of an inverter fault, a temperature sensor fault, and no fault in response to the plurality of health indicators.

12. The method of claim 11, further comprising the plurality of health indicators to a plurality of predetermined thresholds.

13. The method of claim 12, further comprising identifying the inverter fault in response to all of the plurality of health indicators being greater than corresponding ones of the plurality of predetermined thresholds, respectively.

14. The method of claim 12, further comprising identifying the temperature sensor fault in response to one or more of the plurality of health indicators being greater than corresponding ones of the plurality of predetermined thresholds and at least one of the plurality of health indicators being less than a corresponding one of the plurality of predetermined thresholds.

15. The method of claim 11, further comprising estimating the power loss including conduction loss and switching loss in response to vehicle operating conditions.

16. The method of claim 11, wherein the one or more components of the power inverter comprise a diode and a power switch and further comprising:
   calculating a voltage drop, an on resistance, a least one of a power loss of the diode and a power loss of the power switch, a power factor, and a modulation index in response to phase voltage and a filtered switch current; and
   calculating conduction and switching loss of the at least one of the power switch and the diode in response to the voltage drop, the on resistance, the at least one of the power loss of the diode and the power loss of the power switch, the power factor, the modulation index and a switching strategy/frequency.

17. The method of claim 11, wherein:
   the one or more components of the power inverter comprise at least one of a diode and a power switch; and
   the estimated junction temperature corresponds to at least one of an estimated power switch junction temperature and an estimated diode junction temperature.

18. The method of claim 17, further comprising generating the plurality of health indicators in response to an absolute value of a difference between the estimated diode junction temperature of the plurality of inverter legs and a product of the plurality of sensed temperatures of the plurality of inverter legs and a plurality of predetermined constants, respectively.

19. The method of claim 18, further comprising generating the plurality of health indicators in response to an absolute value of a difference between the estimated power switch junction temperature of the plurality of inverter legs and a product of the plurality of sensed temperatures of the plurality of inverter legs and a plurality of constants, respectively.

20. The method of claim 11, further comprising:
   generating a first fault type in response to the inverter fault; and
   generating a second fault type in response the temperature sensor fault.

* * * * *